US006403879B1

(12) United States Patent
Clements et al.

(10) Patent No.: US 6,403,879 B1
(45) Date of Patent: Jun. 11, 2002

(54) ELECTRONIC CHASSIS HAVING AN EMI GASKET AND INTEGRAL VENTILATION HOLES

(75) Inventors: Brad E Clements, Ft. Collins; Angie Minchiello, Fort Collins, both of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/598,096

(22) Filed: Jun. 21, 2000

(51) Int. Cl.[7] .................................................. H05K 9/00
(52) U.S. Cl. ............................... 174/35 GC; 174/35 R; 361/800; 361/816; 361/818
(58) Field of Search .................... 174/35 GC, 35 R; 361/683, 686, 690, 692, 748, 753, 796, 799, 800, 816, 818; 439/927, 939

(56) References Cited

U.S. PATENT DOCUMENTS 5,650,922 A * 7/1997 Ho ............................. 361/799
5,856,632 A * 1/1999 Bostrom et al. ........ 174/35 GC
5,929,376 A * 7/1999 Doun et al. ................ 174/35 R
5,957,465 A * 9/1999 Gonsalves et al. .......... 277/637
5,975,953 A * 11/1999 Peterson ...................... 439/607
6,058,025 A * 5/2000 Ecker et al. ................. 361/816
6,201,711 B1 * 3/2001 Cherniski et al. ........... 361/800

* cited by examiner

Primary Examiner—Dean A. Reichard
Assistant Examiner—Carmelo Oliva

(57) ABSTRACT

An electronic device has a chassis having a plurality of structural members with slots located therebetween. The slots serve as conduits between electronic components located within the electronic device and peripheral devices. The structural members are folded to provide reinforcement. The reinforcement allows the structural members to be relatively small and to have a plurality of ventilation holes formed therein. A gasket is placed between the chassis and the electronic components to attenuate EMI passing through the chassis. The gasket has a plurality of tabs formed thereon that serve to bias the gasket against the electronic components and to electrically connect the electronic devices to the chassis.

17 Claims, 5 Drawing Sheets

ELECTRONIC CHASSIS HAVING AN EMI GASKET AND INTEGRAL VENTILATION HOLES

TECHNICAL FIELD OF THE INVENTION

The present invention relates to electromagnetic shielding and, more particularly, to an electronic device having an electromagnetic gasket located between a chassis and an electronic component located within the electronic device.

BACKGROUND OF THE INVENTION

Many electronic devices, such as computers, are made from a plurality of various electronic components, such as printed circuit boards, located within a single housing. The printed circuit boards are typically electrically and mechanically connected to a backplane or motherboard that is located within the housing. Many of the circuit boards are removable and are used to connect peripheral devices to the electronic device. For example peripheral component interconnect (PCI) circuit boards or cards are often used to connect computer peripheral devices to a computer, e.g., a computer motherboard.

Developments in electronics have increased the capabilities of many electronic devices and decreased the sizes of these electronic devices. As the capabilities of the electronic devices have increased, the number of electronic components, such as PCI boards, required to be located within the electronic devices has generally increased. The reduced sizes of the electronic devices coupled with the increased number of electronic components located within the electronic devices have caused the density of electronic components located within the electronic devices to increase.

The capabilities of the electronic components have increased to meet the increased capabilities of the electronic devices. The increased capabilities of the electronic components typically cause them to operate at higher temperatures. The above-described higher density of electronic components within the electronic devices causes a higher heat density within the electronic devices in the proximity of the electronic components. Excessive heat generally has detrimental affects on the electronic components.

In the situation where the electronic device is a computer, the electronic components described above are often PCI boards. Many of the PCI boards are mounted to the motherboard of the computer so that they extend perpendicular from the motherboard and are, thus, parallel to each other. This arrangement of PCI boards provides for a high density of PCI boards within a small computer housing, however, it typically does not allow for the free flow of cooling air within the housing. The PCI boards generally do not perform reliably unless they are maintained relatively cool during their operation. Accordingly, the lack of free flowing air causes a trade off between the capabilities and the sizes of computers. For example, the capabilities of computers may increase, however, the sizes of the housings has to increase in order to provide the necessary airflow.

Another drawback of the improved capabilities of the electronic components is that many of the electronic components emit and/or are susceptible to electromagnetic interference (EMI). Accordingly, many of the electronic devices are required to have extensive EMI shielding to shield the electronic components. The EMI shielding requirements present problems with PCI boards because the PCI boards provide an interface to external peripheral components and are, thus, required to be associated with openings in the electronic devices. These openings are generally detrimental to the EMI requirements of the electronic devices. Some PCI boards have a conductive bulkhead that covers the opening in the electronic devices, which serves to attenuate EMI. These bulkheads, however, do not sufficiently attenuate EMI for many high performance PCI boards because they cannot be grounded properly.

As more PCI boards are used in electronic devices, more openings have to be placed in the electronic devices to accommodate the PCI boards. More openings also have to be provided to accommodate the increased airflow required to cool the PCI boards. These openings degrade the structural integrity of the electronic devices in addition to degrading the EMI shielding of the electronic devices.

Therefore, a need exists for an electronic device having improved EMI shielding and ventilation, but which does not have reduced structural integrity.

SUMMARY OF THE INVENTION

The present invention is directed toward an electronic device having improved electromagnetic interference (EMI) shielding, ventilation, and structural integrity. The electronic device may have a chassis for supporting electronic components, such as a peripheral component interconnect (PCI) boards, and a mother board to which the electronic components are attached. The chassis may comprise at least a first member and a second member extending between a first panel and a second panel. The first and second members may have a plurality of ventilation holes formed therein. A space may exist between the first member and the second member and may be occupied by a bulkhead portion of a PCI board.

A conductive sheet (EMI gasket) having a first portion and a second portion may be placed adjacent the first member and the second member. The first portion and the second portion may have a plurality of holes formed therein that correspond to the plurality of ventilation holes formed in the first and second chassis members. The conductive sheet first portion is located adjacent the first member and the conductive sheet second portion is located adjacent the second member. The conductive sheet is positioned so that the holes in the conductive sheet are aligned with the ventilation holes in the chassis members. A plurality of tabs are formed into the conductive sheet and serve to improve the electrical contact between the chassis and the PCI boards by causing the conductive sheet to have a spring force acting between the chassis and the PCI boards.

DETAILED DESCRIPTION OF THE INVENTION

Figure 1:
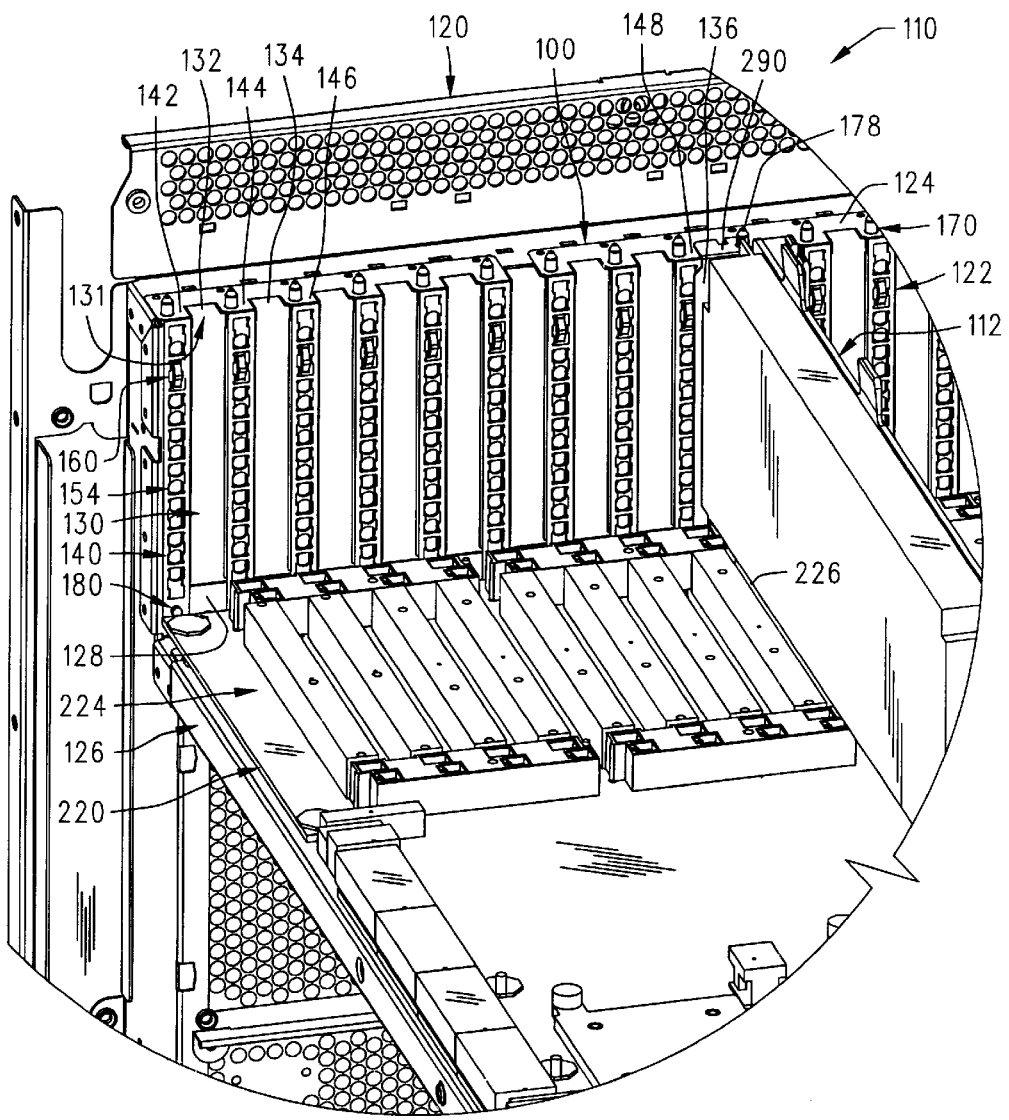
FIG. 1 is an internal perspective view of an electronic device having an electromagnetic gasket encompassing a plurality of PCI slots formed into the electronic device.

FIGS. 1 through 5, in general, illustrate a chassis 120 for mechanically securing electronic components 112. The chassis 120 may comprise a first member 142 extending between a first panel 124 and a second panel 128, wherein the first member 142 has a first plurality of holes 154 formed therein. The chassis 120 may also comprise a second member 144 extending between the first panel 124 and the second panel 128, wherein the second member 144 has a second plurality of holes 154 formed therein. A space 132 may exist between the first member 142 and the second member 144. The chassis 120 may also comprise a conductive sheet 100 having a first portion and a second portion. The conductive sheet first portion may be located adjacent the first member 142 and may have a first plurality of holes 260 formed therein that are aligned with the first member first plurality of holes 154. The conductive sheet second portion may be located adjacent the second member 144 and may have a second plurality of holes 260 formed therein that are aligned with the second member second plurality of holes 154.

FIGS. 1 through 5 also, in general, illustrate an electrically conductive gasket 100 comprising a first portion 252 extending between a second portion 240 and a third portion 280. The first portion 252 may have a first edge 254. At least one hole 262 may be formed into the first portion 252, wherein the at least one hole 262 has a first edge 264 located adjacent the first portion first edge 254. A first tab 270 may extend from the at least one hole first edge 264 and may have an end 271 located opposite the at least one hole first edge 264. The first tab 270 may be configured so that the end 271 of the first tab 270 is proximate the first portion first edge 254.

Having generally described the gasket 100 and the chassis 120, they will now be described in greater detail.

Referring to FIG. 1, the electromagnetic gasket 100 (sometimes referred to herein simply as the gasket) described herein is depicted as being incorporated into an electronic device 110. It should be noted that the view of FIG. 1 is of the interior of the electronic device 110. The electronic device 110 described herein is a device adapted to have a plurality of peripheral component interconnect (PCI) circuits or boards located therein. For illustration purposes, the electronic device 110 illustrated herein has only a single PCI board 112 located therein. As will be described herein, the gasket 100 serves to electrically connect the PCI board 112 to a chassis ground. It is to be understood that the description of the electronic device 110 having PCI boards located therein is for illustration purposes only and that the PCI boards described herein may be substituted by other conventional electronic components.

The electronic device 110 will now be described followed by a description of the gasket 100 and its incorporation into the electronic device 110. The electronic device 110 has a chassis 120 that is adapted to hold various electronic components that are located within the electronic device 110. It should be noted that the specific chassis 120 described herein is used for illustration purposes only and that other variations of the chassis 120 may be used with respect to the electronic device 110 and the gasket 100. The chassis 120 may have a vertical portion 122 with a horizontal ledge 124 formed therein. The ledge 124 may be a horizontally extending portion of the vertical portion 122. Another portion of the vertical portion is referred to herein as the panel 128 and is located a distance below the horizontal ledge 124. A horizontal platform 126 may be attached to the vertical portion 122 of the chassis in the proximity of the panel 128. It should be noted that the ledge 124 and the panel 128 are sometimes referred to herein as the first portion and the second portion of the chassis 120.

The vertical portion 122 of the chassis 120 may have a plurality of openings or slots 130 formed therein. The slots 130 may extend between the ledge 124 and the panel 128 and may serve as conduits between the electronic device 110 and peripheral components located outside of the electronic device 110. The slots 130 may extend a relatively small distance into the ledge 124 to form a plurality of notches 131 within the ledge 124. The following description will focus on three slots, a first slot 132, a second slot 134, and a third slot 136, which are representative of all the slots 130. As will be described in greater detail below, the PCI board 112 is associated with the third slot 136. The slots 130 may extend between a plurality of vertical members 140, wherein the vertical members 140 may be integrally formed within the vertical portion 122. For illustration purposes, a first vertical member 142, a second vertical member 144, a third vertical member 146, a fourth vertical member 148, and a fifth vertical member 150, not shown in FIG. 1, are described herein and are representative of all the vertical members 140.

Figure 2:
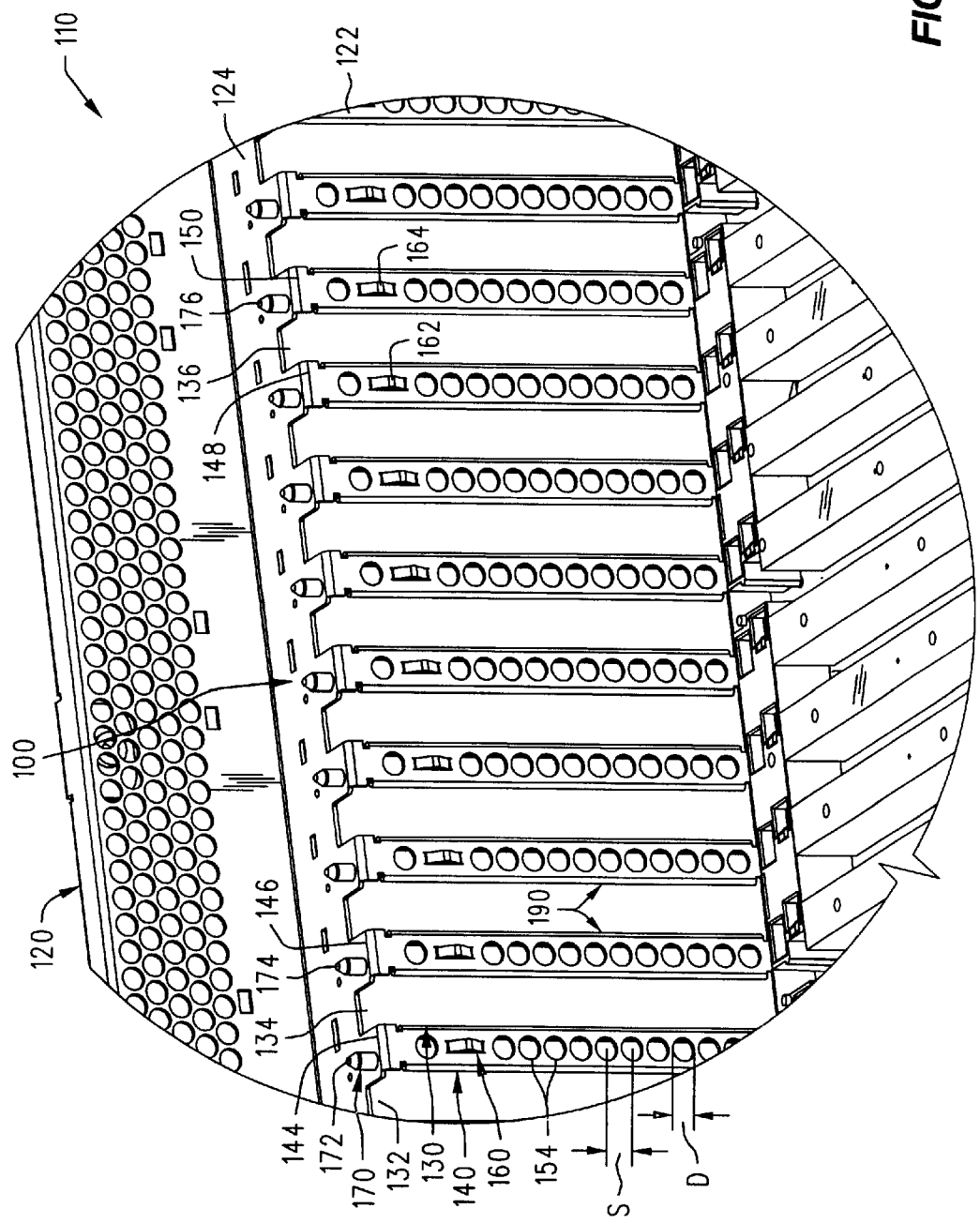
FIG. 2 is an enlarged view of the PCI slots and surrounding hardware of FIG. 1 with the electromagnetic gasket removed.

Referring to FIG. 2, which is an enlarged partial view of the electronic device 110 with the gasket 100 and PCI board 112 removed, the vertical members 140 may each have a plurality of ventilation holes 154 formed therein. The ventilation holes 154 formed in each of the vertical members 140 may have a diameter D and may be spaced a distance S from each other. The ventilation holes 154 serve the purpose of providing an air path between the exterior and the interior of the electronic device 110 to cool the PCI boards and other electronic components located within the electronic device 110. The diameter D of the ventilation holes 154 is appropriately sized to attenuate electromagnetic interference (EMI) while allowing a sufficient quantity of air to pass therethrough for cooling purposes. The frequency of EMI that is attenuated by the holes 154 is proportional to the diameter D of the ventilation holes 154, wherein a smaller diameter D attenuates higher EMI frequencies. The amount of airflow that can pass between the interior and the exterior of the electronic device 110 is proportional to the density and diameters D of the ventilation holes 154.

Tradeoffs are considered when choosing the diameters D of the ventilation holes 154. Ventilation holes 154 with smaller diameters D attenuate higher EMI frequencies, however, they reduce the quantity of air that may pass through them. During design of the electronic device 110, the diameters D of the holes 154 are chosen to attenuate the EMI while providing adequate airflow. The spacing S of the ventilation holes 154 is chosen to provide adequate airflow without sacrificing the structural integrity of the chassis 120. In the non-limiting example described herein, the diameters D of the ventilation holes 154 are approximately 5.5 millimeters and the spacing is approximately 6.5 millimeters.

Each of the vertical members 140 may have a guide 160 formed therein. The guides 160 may, as examples, be protrusions that are pressed out of the vertical members 140. For reference purposes, a first guide 162 and a second guide 164 are shown formed into the fourth vertical member 148 and the fifth vertical member 150 respectively. The guides 160 serve to guide the PCI boards during installation into the electronic device 110 and to support the PCI boards within the electronic device 110. Accordingly, the first guide 162 and the second guide 164 serve to support the PCI board 112 within the electronic device 110.

A plurality of pins 170 may be attached to and extend from the ledge 124 of the chassis 120. As will be described in greater detail below, the pins 170 may serve to support PCI cards within the electronic device 110 as well as to secure the gasket 100, FIG. 1, in a fixed position relative to the chassis 120. For reference purposes, three pins will be described herein, a first pin 172, FIG. 1, a second pin 174, and a third pin 176. Referring briefly to FIG. 1, a plurality of rivets 180 or other protrusions may be attached to or extend from the panel 128 of the chassis 120. More specifically one rivet 180 may be located below each of the vertical members 140. As will be described in greater detail below, the rivets 180 along with the pins 170 may serve to secure the gasket 100 to the chassis 120.

Figure 3:
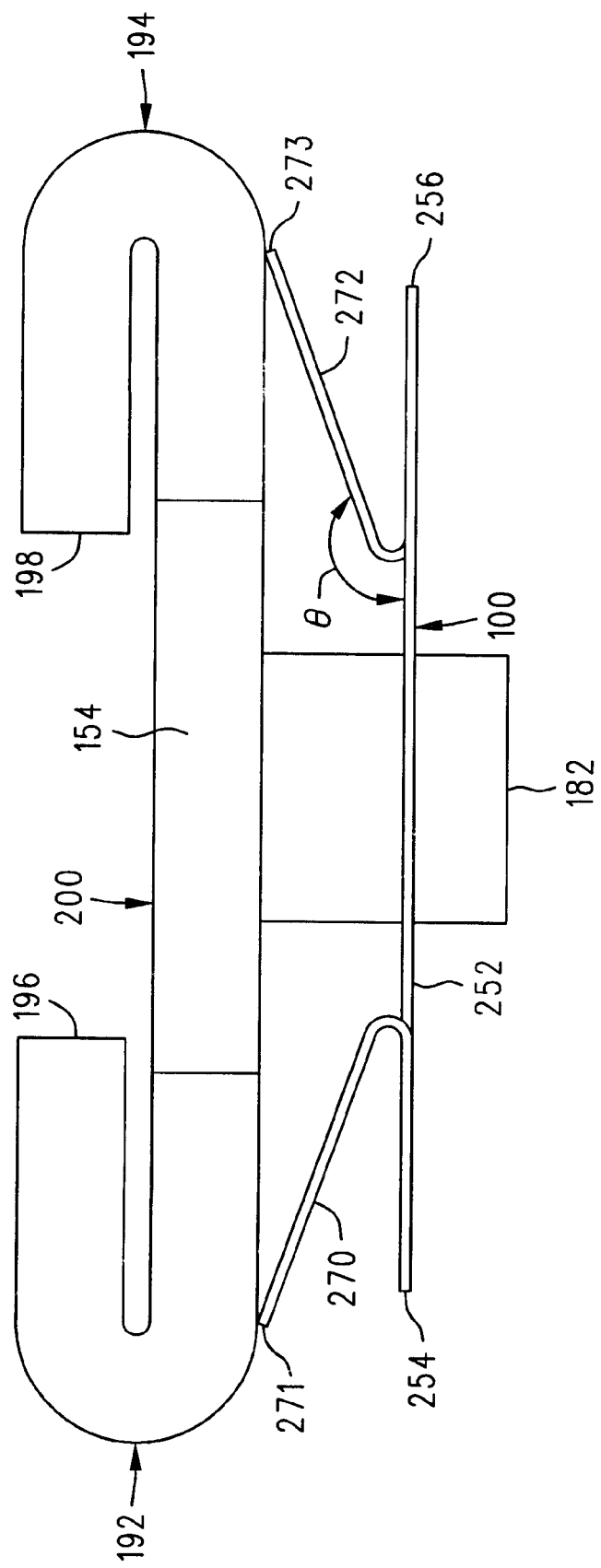
FIG. 3 is a cross sectional view of a vertical member forming a PCI slot in the electronic device of FIG. 1 with the electromagnetic gasket located adjacent the vertical member.

In a conventional electronic device, ventilation holes located within support members significantly reduce the structural integrity of the electronic device by reducing the amount of material in the support members. Referring again to FIG. 2, the electronic device 110 disclosed herein overcomes the structural integrity problem by forming hems 190 into the edges of the vertical members 140. The hems 190 improve the structural integrity of the vertical members 140 by reducing the flexibility of the vertical members 140. Referring to FIG. 3, which is a cross-sectional view of the third vertical member 146, a first hem 192 and a second hem 194 may be formed into the third vertical member 146. As illustrated in FIG. 3, the third vertical member 146 has a first edge 196 and a second edge 198 with a planar portion 200 located therebetween. The first hem 192, in a non-limiting embodiment, is formed into the third vertical member 146 so that the first edge 196 is located adjacent the planar portion 200. Likewise, the second hem 194 is formed into the third vertical member 146 so that the second edge 198 is located adjacent the planar portion 200. The first hem 192 and the second hem 194 may, as an example, be formed by bending the third vertical member 146. The first hem 192 and the second hem 194 formed into the third vertical member 146 reduce the flexibility and deflection of the third support member 146 and, thus, improve its structural integrity.

The hems 190 also reduce human contact with the edges 196, 198 and improve the aesthetics of the electronic device 110. The edges 196, 198 may be relatively sharp or they may have burrs that can injure an operator or assembler of the electronic device 110. By folding the edges 196, 198 toward the planar portion 200 as described above, the burrs are located adjacent the vertical members 140, FIG. 1, so that an operator or assembler is less likely to encounter one. The edges 196, 198 are typically areas that are difficult to plate and, thus, are typically not aesthetic. By folding the edges 196, 198 as described above, they are substantially placed out of visual sight, which improves the aesthetics of the chassis 120 and, thus, the electronic device 110.

Referring again to FIG. 1, having described the vertical portion 122 of the chassis 120, the horizontal platform 126 will now be described. The horizontal platform 126 may be attached to and extend substantially perpendicular from the panel 128 of the vertical portion 122 of the chassis 120. The horizontal platform 126 may serve to physically support a circuit board 220 within the electronic device 110. The circuit board 220 may, as an example, be a motherboard or other processing component located within a computer or a server. The circuit board 220 may have a plurality of slots 224 that serve to mechanically and electrically connect electronic components, such as the above-described PCI boards, to the circuit board 220. Accordingly, each of the slots 224 on the circuit board 220 is associated with one of the slots 130 in the chassis 120. For illustration purposes, reference is made to a slot 226 in which the PCI board 112 is mechanically and electrically connected.

Having described the chassis 120 of the electronic device 110, the gasket 100 and its association with the chassis 120 will now be described.

Figure 4:
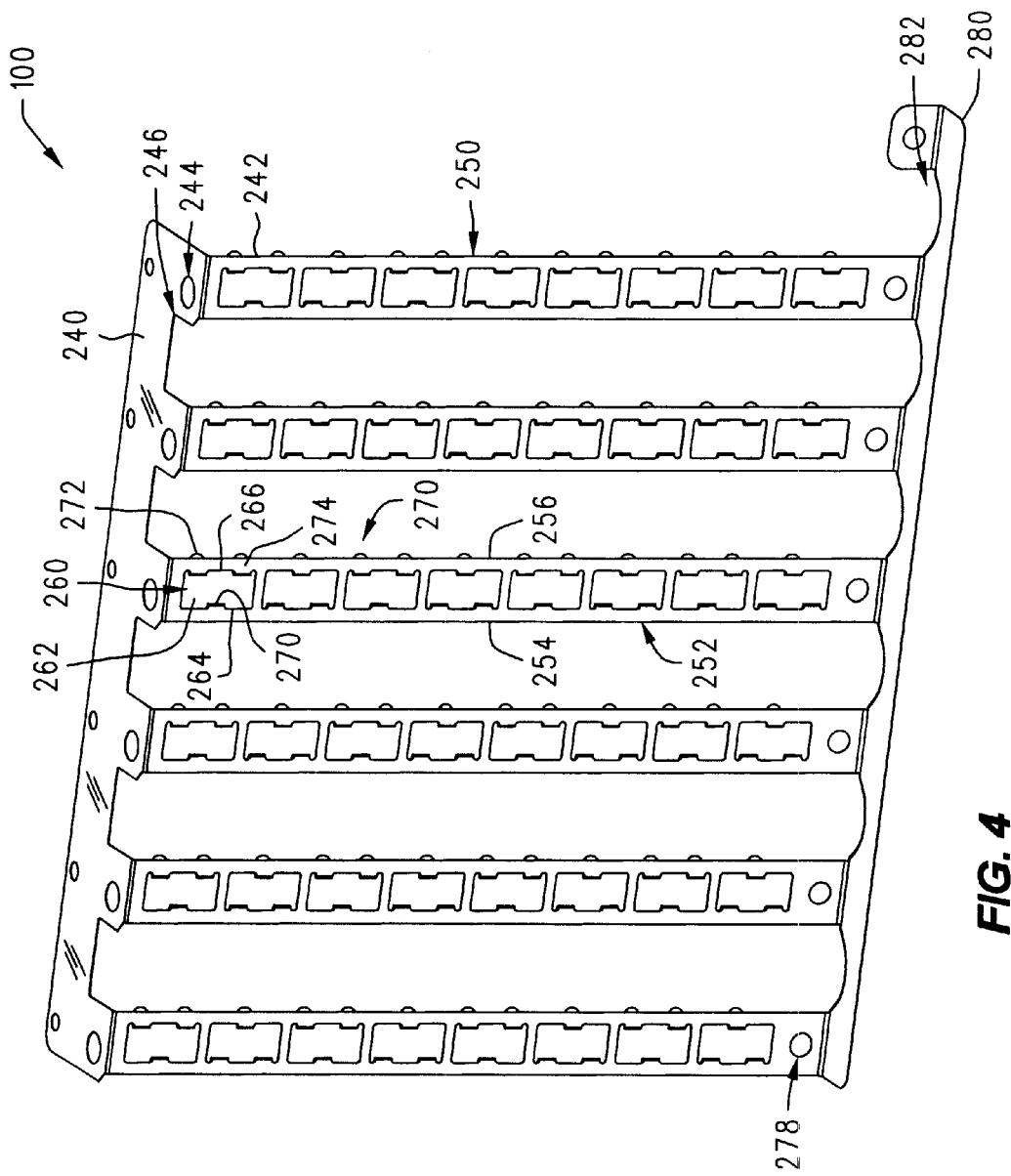
FIG. 4 is a view of the gasket of FIG. 1 separate from the electronic device.
Figure 5:
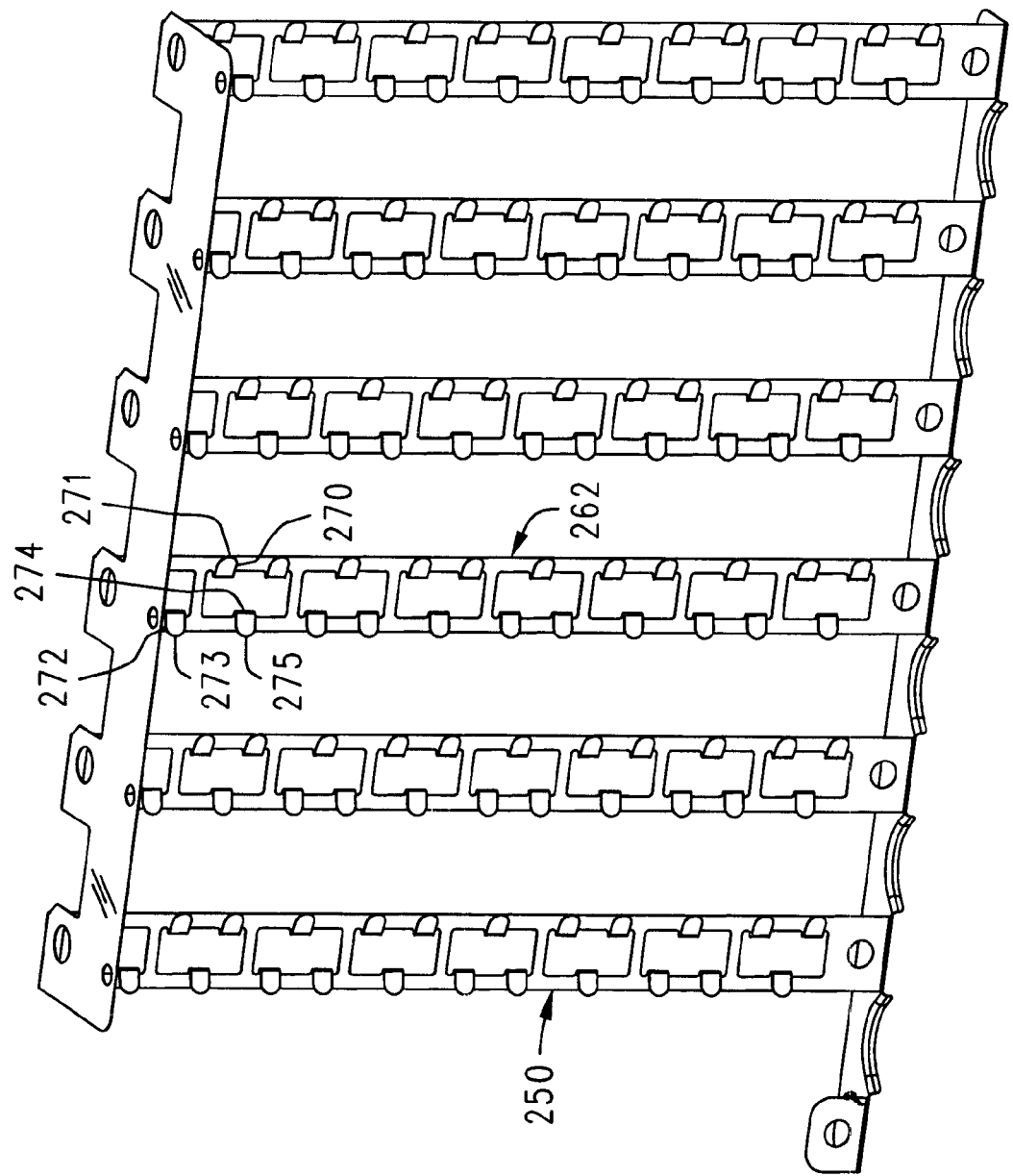
FIG. 5 is a reverse view of the gasket of FIG. 4.

An exploded view of the gasket 100 separate from the electronic device 110 is illustrated in FIGS. 4 and 5. FIG. 4 is a perspective view of the gasket 100 from the same perspective as FIG. 1. FIG. 5 is a view from the opposite side of the gasket 100 from the view of FIG. 4. The gasket 100 may have a horizontal portion 240, a vertical portion 242, and a lower portion 280. The horizontal portion 240 may be substantially perpendicular to the vertical portion 242 and parallel to the lower portion 280. The horizontal portion 240 may be adapted to be located adjacent the ledge 124, FIG. 2, of the chassis 120. The vertical portion 242 may be adapted to be located adjacent the vertical portion 122, FIG. 2, of the chassis 120. The gasket 100 may, as a non-limiting example, be fabricated from a single piece of electrically conductive sheet metal, such as stainless steel. It should be noted that the electronic device 110, FIG. 1, may have several gaskets 100 located therein.

The horizontal portion 240 of the gasket 100 may have a plurality of holes 244 and notches 246 formed therein. The holes 244 may be appropriately sized and spaced to receive the pins 170, FIG. 2, attached to the ledge 124 of the chassis 120. The notches 246 may correspond to the sizes and shapes of the notches 131, FIG. 1, formed into the ledge 124 of the chassis 120. The lower portion 280 of the gasket 100 may have a plurality of recessed portions 282 formed therein. The recessed portions 282 may serve to receive tail portions of PCI board bulkheads as is described below. In another embodiment of the gasket 100, the lower portion 280 may intersect the vertical portion 242 at an acute angle, which facilitates the insertion of the bulkhead tails into the recessed portions 282.

The vertical portion 242 of the gasket 100 may have a plurality of vertical members 250 that have similar sizes and shapes as the vertical members 140, FIG. 1, of the chassis 120. The vertical members 250 may extend between the horizontal portion 240 and the lower portion 280 of the gasket 100. For illustration purposes, reference is made to a first vertical member 252 that is representative of all of the vertical members 250. The first vertical member 252 has a first edge 254 and a second edge 256 with a plurality of openings 260 located therebetween. Each of the openings 260 may, as a non-limiting example, be appropriately sized to encompass two of the ventilation holes 154, FIG. 2, formed into the vertical members 140. Some of the openings 260 may also be appropriately sized to encompass the guides 160 formed into the vertical members 140 of the chassis 120.

For further illustration purposes, reference is made to a first opening 262 that is substantially representative of all the openings 260. The first opening 262 has a first edge 264 and a second edge 266 with a plurality of tabs 268 extending from the edges 264, 266. In the non-limiting embodiment described herein, three tabs 268 are illustrated extending into the first opening 262, a first tab 270, a second tab 272, and a third tab 274. The first tab 270 has a first end 271, the second tab 272 has a second end 273, and the third tab 274 has a third end 275. The ends of the tabs 268 are located opposite the edges 264, 266. The openings 260 may be punched out of the vertical members 250 to form the tabs 268 as illustrated by the broken lines in the first opening 262 of FIG. 4.

After the first opening 262 is formed, the tabs 268 may extend into the opening 262. Subsequent to forming the first opening 262, the tabs 268 may be folded or bent to the positions illustrated by the solid lines in FIGS. 4 and 5. More specifically, the ends of the tabs 268 may be bent toward their corresponding edges 254, 256 of the vertical members 250. For example, the first end 271 of the first tab 270 is bent to be in the proximity of the first edge 254 of the first vertical member 252. Likewise, the second end 273 of the second tab 272 and the third end 275 of the third tab 274 are bent to be in the proximity of the second edge 256 of the first vertical member 252. The bending of the tabs 268 is illustrated in FIG. 3 by the angle θ, wherein the angle θ is the angle between a tab and the remaining portion of the gasket 100. The angle θ may be equal to approximately one-hundred sixty degrees. The bending of the tabs 268 causes the tabs 268 to function as springs, that serve to assure that the gasket 100 contacts both the PCI boards located in the electronic device 110, FIG. 1, and the chassis 120, as is described below.

Each of the vertical members 250 may have a hole 278 formed therein in the proximity of the lower portion 280. The holes 278 may be appropriately sized and positioned to receive the rivets 180, FIG. 1, or other protrusions located in the panel 128 of the chassis 120. As will be described below, the holes 244, 278 serve to secure the gasket 100 in a fixed location relative to the chassis Having described the gasket 100 and the chassis 120, FIG. 1, they will now be described integrated into the electronic device 110.

Referring again to FIGS. 1 and 4, the gasket 100 is placed adjacent the ledge 124 and the vertical portion 122 of the chassis 120. It should be noted that FIG. 1 shows two substantially similar gaskets 100 located within the chassis 120, however, only one gasket 100 will be described herein. The use of multiple smaller gaskets gasket 100 may simplify the fabrication process of the gaskets gasket 100 and the assembly of the gaskets 100 to the chassis 120. The gasket 100 may be installed onto the chassis 120 by placing the holes 244 in the horizontal portion 240 of the gasket 100 over the pins 170, FIG. 2, extending from the ledge 124 of the chassis 120. The vertical members 250 of the gasket 100 are then pulled taunt and the holes 278 in the vertical members 250 are placed over the rivets 180 in the horizontal platform 126 of the chassis 120. Accordingly, the vertical members 250 of the gasket 100 contact the vertical members 140 of the chassis 120. More specifically, the tabs 268, FIG. 4, contact the vertical members 140 of the chassis 120.

As shown in FIG. 1, the ventilation holes 154 in the vertical members 140 of the chassis 120 are aligned with the openings 260 in the gasket 100. Likewise, the guides 160 on the vertical members 140 are aligned with some of the openings 260 in the gasket. The openings 260 in the gasket 100 may have widths of about 5.5 millimeters, so as to correspond to the diameters of the holes 154 in the vertical members 140. It should also be noted that the tabs 268, FIG. 4, are positioned so that at least one tab is adjacent each ventilation hole in the vertical members 140. This positioning of the tabs serves to improve the EMI attenuation between the interior and the exterior of the electronic device 110.

The contact between the gasket 100 and the third vertical member 146 of the chassis 120 is illustrated in greater detail in FIG. 3. As shown in FIG. 3, the ends of the tabs 268 contact the third vertical member 146. Thus, the gasket 100 electrically contacts the chassis 120, FIG. 1. It should be noted that any portion of the tabs 268 may contact the third vertical member 146. As described above, the tabs 268 may also function as springs. Accordingly, the tabs 268 may also serve to bias the gasket 100 away from the third vertical member 146. This biasing applies to the vertical members 250 of the gasket 100 in general wherein the vertical members 250 are biased away from the vertical members 140 of the chassis 120.

Having described the electronic device 110, the operation of the electronic device 110 with reference to the PCI board 112 and the gasket 100 will now be described. The gasket 100 serves to electrically connect bulkhead portions of PCI boards to the chassis 120. This electrical connection is illustrated by the PCI board 112 of FIG. 1. The PCI board 112 has an electrically conductive bulkhead 290 that serves to electrically and mechanically connect the PCI board 112 to the third slot 136 of the chassis 120.

The bulkhead 290 may be an electrically conductive rigid member that provides structural support to the PCI board 112. In addition, the bulkhead 290 prevents EMI from interfering with the operation of the PCI board 112 and, thus, is required to be grounded relative to the chassis 120, preferably at several locations. As described below, the gasket 100 serves to ground the bulkhead 290 to the chassis 120 at several locations. It should be noted that the bulkhead may also prevent EMI generated by the PCI board 112 from interfering with electronic devices located in the vicinity of the electronic device 110.

The PCI board 112 is installed into the electronic device 110 by placing the bulkhead 290 adjacent the third slot 136. With additional reference to FIG. 2, the bulkhead 290 is located adjacent the fourth vertical member 148 and the fifth vertical member 150 of the chassis. The portions of the gasket 100 located adjacent the fourth vertical member 148 and the fifth vertical member 150 of the chassis 120 are positioned between the bulkhead 290 and the chassis 120. The PCI board 112 is then slid into the slot 226 on the circuit board 220. Because the tabs 268, FIG. 4, on the gasket 100 face the vertical members 140 of the chassis 120, the gasket 100 presents a relatively smooth surface for the bulkhead 290 to slide against as the PCI board 112 is installed into the chassis 120. Accordingly the PCI board 112 will not bind on the gasket 100 as it is installed into the electronic device 110. The first guide 162 and the second guide 164 serve to prevent the PCI board 112 from rotating as it is slid toward the circuit board 220 and into the slot 226. The first guide 162 and the second guide 164 also serve to prevent the PCI board 112 from rotating after it has been secured to the circuit board 220.

As the PCI board 112 is installed into the electronic device 110 it is connected to the slot 226 and secured within the chassis 120. For example, the bulkhead 290 may have a conventional notch formed therein that is received by the fourth pin 178. The notch and pin coupling serves to secure the PCI board 112 in a fixed position relative to the chassis 120. The bulkhead may have a conventional tail portion, not shown, that may be located between the chassis 120 and the recessed portions 282, FIG. 5 of the lower portion 280 of the gasket 100. The tail serves to guide the PCI board 112 into position relative to the third slot 136 as well as to attenuate EMI. When the PCI board 112 is in place as illustrated in FIG. 1, the bulkhead 290 is electrically connected to the gasket 100 and, thus, the chassis 120, at a plurality of locations, which reduces the EMI effects on the PCI board 112.

As described above with reference to FIG. 4, the lower portion of the gasket 100 may intersect the vertical portion 242 at an acute angle. This acute angle serves to open the recesses 282, which facilitates the insertion of the tail portion of the bulkhead 290 into the recesses 282.

The electronic device 110 incorporating the gasket 100 as described herein has several advantages over conventional electronic devices. For example, the ventilation holes 154 in the chassis 120 allow large quantities of air to flow past the PCI boards. Conventional chassis of electronic devices do not have the structural integrity to provide for ventilation holes in the vertical members 140 of the chassis 120, while maintaining structural integrity. Accordingly, the spaces between the PCI boards in conventional electronic devices have stagnant air that cannot be circulated efficiently, which caused the PCI boards to operate at higher temperatures. The improved ventilation provides for greater air circulation, which reduces the stagnant air space and cools the PCI boards more efficiently.

The improved structural integrity of the vertical members 140 permits the vertical members 140 to be narrower than in a conventional electronic device. For example, a conventional electronic device may only be able to place the PCI boards at spacings of one inch due to the limited structural integrity of the chassis. The electronic device 110 may have the PCI boards spaced at less than one inch because the chassis 120 will support thinner vertical members 140. For example, the PCI boards may be separated by a distance of approximately 0.9 inches. This improved structural integrity allows for a greater number of holes 154 to be formed into the vertical members 140 as described above.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A chassis for mechanically securing electronic components, said chassis comprising:
   a first member extending between a first panel and a second panel, said first member having a first plurality of holes formed therein, said first member having a first edge and a second edge, at least a portion of said first edge being wrapped toward said second edge to form a first hem in at least a portion of said first member;
   a second member extending between said first panel and said second panel, said second member having a second plurality of holes formed therein;
   a space between said first member and said second member; and
   a conductive sheet having a first portion and a second portion, said conductive sheet first portion being located adjacent said first member and having a first plurality of holes formed therein that are aligned with said first member first plurality of holes, said conductive sheet second portion being located adjacent said second member and having a second plurality of holes formed therein that are aligned with said second member second plurality of holes.

2. The chassis of claim 1 wherein said conductive sheet further comprises a third portion that is electrically connected between said conductive sheet first portion and said conductive sheet second portion.

3. The chassis of claim 1 wherein said conductive sheet first portion has a first outer edge, wherein at least one of said holes in said first portion has a first inner edge located adjacent said first outer edge of said first portion, wherein said first inner edge has a first tab extending therefrom, wherein said first tab has an end located opposite said first inner edge, and wherein said first tab is configured so that said end is proximate said first outer edge.

4. The chassis of claim 3 wherein said first tab intersects said first portion at an angle of about twenty degrees.

5. The chassis of claim 3 wherein said conductive sheet first portion has a second outer edge, wherein said at least one of said holes in said conductive sheet has a second inner edge located adjacent said second outer edge of said first portion, wherein said second inner edge has a second tab extending therefrom, wherein said second tab has an end located opposite said second inner edge, and wherein said second tab is configured so that said second end is proximate said second outer edge.

6. The chassis of claim 3 wherein said first tab end electrically contacts said chassis first member.

7. The chassis of claim 3 wherein said first tab biases said conductive sheet first portion away from said chassis first member.

8. The chassis of claim 1 wherein said first member has a protrusion extending therefrom, wherein said conductive sheet first portion has a hole formed therein, and wherein said hole is sized and positioned to receive said first member protrusion.

9. The chassis of claim 1 wherein said first panel has a first protrusion extending therefrom, wherein said conductive sheet has a first hole formed therein, and wherein said first hole is sized and positioned to receive said first protrusion.

10. The chassis of claim 9 wherein said chassis second panel has a second protrusion extending therefrom, wherein said conductive sheet has a second hole formed therein, and wherein said second hole is sized and positioned to receive said second protrusion.

11. The chassis of claim 1 and further comprising an electronic component, said electronic component having a conductive bulkhead attached thereto, wherein said conductive bulkhead electrically contacts said conductive sheet.

12. The chassis of claim 11, wherein said conductive sheet further comprises a fourth portion extending between said conductive sheet first portion and said conductive sheet second portion, said conductive sheet fourth portion having at least one recess formed therein, said conductive sheet fourth portion being located adjacent said chassis second panel.

13. The chassis of claim 1 wherein said chassis first member and said chassis second member are separated by a distance of about 0.9 inches.

14. The chassis of claim 1 wherein said first plurality of holes have diameters of approximately 5.5 millimeters.

15. The chassis of claim 1 wherein said first plurality of holes are spaced a distance of approximately 6.5 millimeters from the center of one hole to the center of an adjacent hole.

16. The chassis of claim 1, wherein at least a portion of said second edge is wrapped toward said first edge to form a first hem in at least a portion of said first member.

17. The chassis of claim 1, wherein said second member comprises a first edge and a second edge, wherein at least a portion of said first edge is wrapped toward said second edge to form a first hem in at least a portion of said second member.

* * * * *